United States Patent [19]
Kickelhain

[11] Patent Number: 5,593,739
[45] Date of Patent: Jan. 14, 1997

[54] METHOD OF PATTERNED METALLIZATION OF SUBSTRATE SURFACES

[75] Inventor: Joerg Kickelhain, Neustadt, Germany

[73] Assignee: LPKF CAD/CAM Systeme GmbH, Garbsen, Germany

[21] Appl. No.: 601,120

[22] Filed: Feb. 14, 1996

[30]   Foreign Application Priority Data

Feb. 14, 1995 [EP] European Pat. Off. .............. 95101969

[51] Int. Cl.⁶ ...................................................... B05D 3/00
[52] U.S. Cl. ............................ 427/555; 101/483; 427/96;
427/98; 427/123; 427/258; 427/264; 427/265;
427/271; 427/272; 427/282; 427/385.5;
427/404; 427/407.1; 427/421; 427/429
[58] Field of Search ................................ 427/96, 98, 123,
427/258, 264, 265, 271, 272, 282, 385.5,
404, 407.1, 429, 421, 430.1, 555, 558,
559

[56]   References Cited

U.S. PATENT DOCUMENTS 4,910,045  3/1990  Giesecke et al. ......................... 427/98

OTHER PUBLICATIONS

Abstract of Published German Patent Application No. DE 3,922,478. (No date avail.).

Primary Examiner—Bernard Pianalto
Attorney, Agent, or Firm—Evenson, McKeown, Edwards & Lenahan P.L.L.C.

[57]   ABSTRACT

A method for patterned metallization of substrate surfaces, especially circuit boards, even three-dimensional ones, by using electromagnetic UV radiation, particularly from an excimer laser. In the method a primer layer is applied to the full substrate surface in the area of a metal layer that is subsequently applied; insulating channels then are made in the primer layer by complete removal of the primer in certain areas by the action of electromagnetic radiation in the UV range; and afterward the remaining patterned primer layer is provided with the metal layer to form conductor strips. The method makes it possible to create insulating channels with extremely sharp contours in the primer layer on the surface of even three-dimensional, electronic circuit media.

15 Claims, 1 Drawing Sheet

METHOD OF PATTERNED METALLIZATION OF SUBSTRATE SURFACES

BACKGROUND OF THE INVENTION

The invention relates to a method for patterned metallization of the surface of even three-dimensional substrates, especially printed circuit boards, using electromagnetic ultraviolet radiation, especially from an excimer laser.

Published German Patent Application No. DE 3,922,478 discloses a method for the patterning of copper-clad polymer surfaces, in which a residual copper layer and a plastic layer are removed by an excimer laser. One disadvantage is the removal of a relatively thick copper layer, especially as regards the great amount of time involved. Another disadvantage lies in the need for roughening or swelling the surface, which is essential to adhesion, before applying a $pdCl_2$-$SnCl_2$ solution or other organic palladium compound to activate the surface. Furthermore, the removal of a relatively thick copper layer entails the production of heat, which results in a reduction of the edge sharpness of the pattern especially through the formation of a sawtooth pattern and is not adequate to the trend towards microstructure formation involving conductor strip widths of less than 50 µm in terminal and connection technology.

The periodical, "Galvanotechnik 84" (1993), no. 2, pages 570 ff., in an article entitled "Herstellung flexibler Schaltungen mit Bayprint—ein zukunftsweisende Technologie" (production of flexible circuits by Bayprint, a technology pointing to the future) describes a process which operates without exposure to light and without etching. A polymer surface is printed with a primer, i.e., with an adhesive coating, by screen printing. The conductor strip patterns are laid out by coating with the primer. The primer is nonconductive, adheres well to the polymer surface, and after a drying process it has a porous texture on one surface which then permits the strong anchoring of a metal coating precipitated non-electrically. The metal layer then forms the conductor strip. This process does have the advantage that it is relatively easy to perform, but as regards the fineness of the conductor pattern applied by screen printing it is limited to conductor strip widths and insulating spacing in excess of 100 µm.

SUMMARY OF THE INVENTION

It is an object of the invention to provide a method of patterned metallization of substrate surfaces which avoids the aforementioned disadvantages.

Another object of the invention is to provide a method which enables a patterned metallization of high resolution on the surface of substrates, particularly circuit boards, in a rapid and economical manner.

These and other objects of the invention are achieved by providing a method for patterned metallization of a substrate surface comprising the steps of applying a layer of primer to entirely cover the substrate surface in an area where a metallized pattern is to be formed; selectively ablating portions of the primer layer from the substrate by exposing said portions to the action of electromagnetic ultraviolet radiation to completely remove the primer from the exposed portions so that a patterned primer layer with primer-free insulating channels formed therein remains on the substrate surface; and thereafter depositing a metal layer on the remaining patterned primer layer to form conducting paths.

As it has been found, due to the fact that a primer coating is applied to the entire substrate surface in the area of a metal coating to be applied subsequently, and the fact that by the action of electromagnetic radiation in the UV range insulating channels are created in the primer by the complete removal of the primer in certain areas, it is possible to position the insulation channels in the primer with extreme sharpness of contour.

Surprisingly, despite the fact that a high resolution and sharp-edged pattern in such a very fine conductor range was not to be expected in the primer coatings used here, which are characterized by a high binder and filler contents and a high solvent content, it is possible by using an excimer laser to produce the insulating channels with extreme sharpness of contour.

It is also surprising that material of the primer coat is removed in a completely cold manner, and no kind of burnout or meltdown phenomena appears at the edges of the insulating channels. Evidently the material of the primer, which is free of any hard-to-remove metals in a metallic bond, is removed by the very high proton energy of the UV laser radiation.

The laser radiation employed here in the stated wavelength range makes it possible to break up the polymer content of the primer cold, and thus to evaporate the inhomogeneous components of the primer, or else due to the high proton energy of the laser radiation employed, it permits polymer fragments to be flung out of the bond by canceling the bond energies of the molecule by means of the very high internal pressure of the plasma. Thus, extremely clean-cut edges can be achieved, which cannot be obtained by long-wave laser radiation.

Preferably, the primer coat is ablated between the positions of the subsequently created conductor strips by means of a krypton-fluoride excimer laser with a wavelength of 248 nm. It has been found that this excimer laser makes possible an especially fine-structured and rapid removal of the primer coat. Thus it is possible, especially in the case of the use of a krypton-fluoride excimer laser, to lay out extremely fine conductor strips and insulating channels with a width of as little as approximately 5 µm. The working range runs from about 5 µm up to about 200 µm, in particular from about 10 µm up to about 100 µm, especially to about 20 to 40 µm.

It is also advantageous in the method of the present invention that, by using excimer lasers combined with optical components, the patterning is not only more even but can also be created on curved substrate materials.

In accordance with one preferred embodiment of the invention, the primer coat in the insulating channels between the later conductor strips is ablated by using a mask disposed in the path of the excimer laser beam or by means of one of the known imaging processes. Furthermore, it is possible to remove the primary coat in the insulating channels by means of patterned scanning by a focused laser beam. These procedures make it possible to cause the laser beam to act on the primer coat in a finely patterned manner.

It is furthermore considerably advantageous that, by means of the method of the invention, three-dimensional electronic circuit media, such as the interior of apparatus housings, can be provided in the manner described with conductor strips of extremely fine structure. As a result, all necessary process steps can be provided even on curved surfaces without problems. Even on the surface of a severely curved substrate, the primer coat can be applied with entirely sufficient uniformity, for example by spraying.

The effect of the radiation from the excimer laser can be applied, for example through templates of appropriate shape, to substrate surfaces with great precision and uniformity, regardless of how curved the substrate surface may be. And furthermore, the final application of the metal coating to curved surfaces presents no difficulty.

In accordance with the invention it is possible to combine electrical and mechanical elements on circuit media of virtually any shape, including substrates having three-dimensional shapes. This makes possible entirely new functions and new miniaturized products. The resultant new possibilities in regard to shape and function, and the great potential for simplification, are considerable.

The use of laser technology in conjunction with the additional process herein described will have a very great influence on the breakthrough of three-dimensional, injection-molded circuit media.

It has surprisingly been found that, according to the invention, with the use of the primer coat described, and of a corresponding excimer laser radiation, extremely fine patterns can be produced by additive technology with a previously unknown quality. The process is characterized by the following advantages:

The possibility of fine and ultra fine patterning.

An adherent, additive circuit production.

Metallization with different metals (e.g., copper, nickel, gold, etc.).

The use of a great variety of base materials (flex, stiff-flex, rigid).

The possible use of a great variety of substrate types such as polyimide (PI), polyethylene (PE), etc.

A cost-effective and fast performance of the process.

It is possible to pattern broad areas, and the process of patterning the entire circuit is completed, as a rule, with fewer laser pulses, so that a considerable time saving is the result.

The technology is appropriate for mass production.

The procedure is surprisingly simple, involving few process steps.

Extremely great precision.

The primer can be applied to the substrate by known methods, such as brushing, spraying, printing, dipping or precipitation. Preferably the primary is applied to the substrate in the form of a nonconductive paste.

The primer coat contains, furthermore, a metallization catalyst, referred to as an activator, which initiates the deposition of the metal coat. The presence of an activator permits subsequent non-electrical application of a metal coating to the primer coat that remains after patterning in order to form the conductor strips. The metallization is performed by means of a non-electrical metallization bath. This kind of additive application of the metal coating promotes the desired, very fine structure of the conductor strips. If the conductor lines must carry higher currents it is also possible to perform a galvanic enhancement of the corresponding geometry.

BRIEF DESCRIPTION OF THE DRAWINGS

The invention will be described in further detail hereinafter with reference to illustrative preferred embodiments shown in the accompanying drawings in which.

DETAILED DESCRIPTION OF THE PREFERRED EMBODIMENTS

Figure 1:
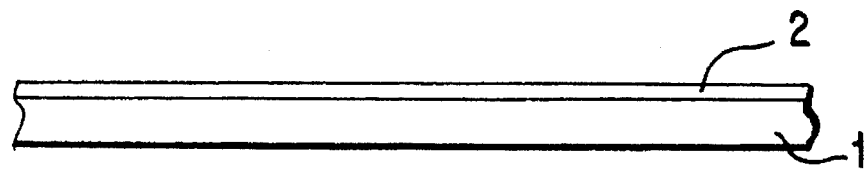
FIG. 1 is a cross sectional view through a circuit board with a primer applied to it.

FIGS. 1 shows a circuit board 1 which comprises, in a known manner, a nonconductive polymer. A primer 2 is applied in a thickness of about 1 μm to 15 μm, preferably 1 μm to 10 μm, to the surface of the circuit board 1. The primer 2 is applied, for example, by brushing, spraying, printing, dipping or precipitation. It is important that the primer 2 is applied to the entire surface of the circuit board so as to cover completely the areas to be metallized on the surface. The primer 2 is preferably imprinted in the form of a nonconductive paste containing a solvent and is optimized as regards adherence to the substrate material. When the primer 2 is then dried, a porous structure forms on its surface. This porous structure promotes the strongly adherent anchoring of a metal layer 3 which is to be applied to the primer 2 in a later procedure.

Figure 2:
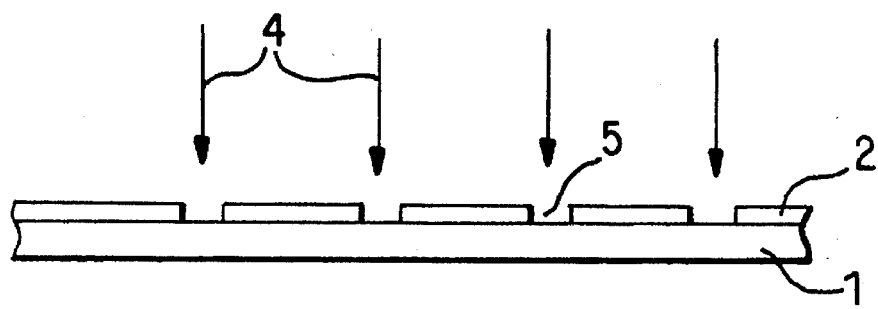
FIG. 2 is a cross sectional view through the circuit board of FIG. 1 with the insulating channels stripped by the action of an excimer laser.

It can be seen in FIG. 2 of the drawing that the primer 2 of the circuit board 1 is patterned by exposure to the radiation 4 of an excimer laser, not shown. The radiation 4 causes the ablation of the primer 2 in the area of the insulating channels 5. It is essential that the primer 2 be completely removed in the area of the insulating channels 5. The fact that the intensity of the radiation 4 of the excimer laser on the primer coat 2 can be very precisely controlled by the number of pulses is a very positive factor. Since the ablation produced by each laser pulse is known, the primer 2 can be completely removed, cleanly and with very sharp edges. Thus, it is also possible to reduce the ablation at the polymer surface of the circuit board 1 to a minimum.

This is very significant not only because it preserves the electrical and mechanical properties of the substrate, but also in view of the known effect of possible foreign deposits on previously laser-exposed surfaces. The time of action of the laser energy and its intensity are determinant factors in the creation of activation centers and therefore in the degree of any later unintended deposit of unwanted matter and metallization by the non-electrical metallizing bath.

Due to the extremely brief and outstandingly controlled depth of ablation by the laser radiation, the probability of producing unwanted deposits on the bottom of the insulating channels during the non-electrical metallization that follows is reduced.

The radiation 4 is limited to the area of the insulating channels 5 of the primer 2, for example, by providing a mask in the path of the excimer laser. Of course, it is also possible to ablate the primer 2 in a very fine pattern by means of an imaging method or of a focused laser beam. Basically, it has been found that the primer 2 is surprisingly well suited to ablation by means, for example, of the radiation of an excimer laser with a wavelength of 248 nm, since the primer 2 contains no metals in a metallic bond, the removal of which by an excimer laser proves to be extremely difficult. The bond energy of the molecules in the primer 2 is easily overcome by the high photon energy of the excimer laser radiation, so that an extremely rapid material removal is accomplished without any heating. As a result, the walls in the area from which the material has been removed are cut with extreme sharpness. It is thus possible to produce in the primer 2 extremely fine patterns with a width of as little as about 5 μm. In the removal of the primer 2, however, it is to be noted that the metal layer 3 later applied might possibly be built up on the flanks of the patterned primer layer at the edges of the insulating channels 5. The insulating channels 5 must for this reason be ablated more widely at each of these edges by the thickness of the of the applied metal layers 3 than is necessary to provide insulation.

Figure 3:
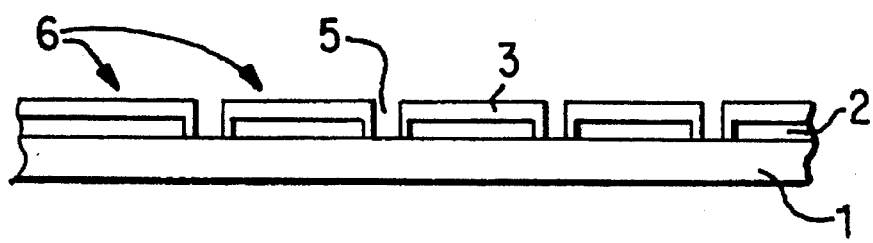
FIG. 3 is a cross sectional view through the circuit board of FIGS. 1 and 2 with a metal layer applied thereto.

After the removal of the primer coat 2 from the area of the insulating channels 5, the metal coat 3 is applied to the patterned primer material that remains, as shown in FIG. 3. This patterned primer coat is formed of an electrically nonconductive primer 2 which contains metallization activators in the form of heavy-metal compounds, preferably palladium/silver compounds, which make it possible afterward to apply the metal layer 3 from a non-electrical metallization bath.

The non-electrical metallization assures an extraordinarily uniform coating thickness. The applied metal coats 3 can also be kept extremely thin, with thicknesses of 0.5 to 30 μm, preferably 1 to 10 μm.

The primer to be patterned may comprise, for example, the following components in accordance with U.S. Pat. No. 4,910,045, the disclosure of which is hereby incorporated by reference, (counterpart of DE 3,743,780):

0.3 to 4.0 wt.-% catalytically active activator material, 3 to 40 wt.-% polyimide binder 1 to 30 wt.-% filler, and 45 to 90 wt.-% solvent.

For adherent metallization of polyimide materials a primer may be prepared, for example, in the following manner:

A 40% solution of an aromatic polyamide imide in N-methylpyrrolidone is prepared from 4,4-diphenylethane diisocyanate and trimellitic acid anhydride. Then 250 parts by weight of this solution of the aromatic polyamide imide, 90 parts by weight of propylene glycol methylether acetate, 2 parts by weight of 3-hepten-2-one palladium chloride and 15 parts by weight of colloidal silica (Aerosil™, 200 m²/g according to BET) are carefully mixed together and dispersed in a pearl mill.

The primer is applied preferably by printing or spraying onto the substrate, i.e., onto the circuit board 1. The substrate together with the primer is then dried for one hour at a temperature of about 250° C.

Then the combination of layers is subjected to an excimer laser beam all over the surface. The partially varying energy density distribution of the secondary laser beam creates insulating channels in the primary layer. This patterning, i.e., this partial removal, is performed by the transfer of the layout information to the substrate surface by various methods:

a) Contact mask (1:1 imaging)

b) Mask projection or wafer projection (reduced-size imaging)

c) Diffraction optics (special optical components)

d) Focused processing.

After these conductor images, i.e., the conductor strips 6 and insulating channels 5, are produced, the metallization of the remaining primer geometries is performed by means of a common commercial non-electrical metallization bath (approximately 2 μm metal thickness in one second) to form the conductive paths. The outstanding adhesion of the deposited metal layers is in the range of about 60N/inch.

If desired, the conductive paths may be thickened by subjecting them to galvanic plating by known electrolytic techniques to increase the thickness of the conductors.

The foregoing description and examples have been set forth merely to illustrate the invention and are not intended to be limiting. Since modifications of the described embodiments incorporating the spirit and substance of the invention may occur to persons skilled in the art, the invention should be construed broadly to include all variations falling within the scope of tile appended claims and equivalents thereof.

What is claimed is:

1. A method for patterned metallization of a substrate surface comprising the steps of:

applying a layer of primer to entirely cover a substrate surface in an area where a metallized pattern is to be formed;

selectively ablating portions of the primer layer from the substrate by exposing said portions to the action of electromagnetic ultraviolet radiation to completely remove the primer from the exposed portions so that a patterned primer layer with primer-free insulating channels formed therein remains on the substrate surface; and thereafter depositing a metal layer on the remaining patterned primer layer to form conducting paths.

2. A method according to claim 1, wherein the substrate surface has a three-dimensional configuration.

3. A method according to claim 1, wherein the substrate is an electronic circuit board.

4. A method according to claim 1, wherein the electromagnetic UV radiation is applied by means of an excimer laser.

5. A method according to claim 4, wherein the laser is a krypton-fluoride excimer laser with a wavelength of 248 nm.

6. A method according to claim 1, wherein the insulating channels in the primer layer are wider by twice the thickness of the deposited metal layer than is necessary for insulation between the conducting paths, such that deposition of the metal layer on flanks of the patterned primer layer leaves sufficiently wide insulating channels between adjacent conductive paths.

7. A method according to claim 1, wherein the insulating channels and conductive paths have widths in the range from 5 μm to 200 μm.

8. A method according to claim 7, wherein the insulating channels and conductive paths have widths in the range from 10 μm to 100 μm.

9. A method according to claim 1, wherein portions of the primer layer are ablated from the substrate by exposing the primer layer to an ultraviolet radiation image corresponding to the insulating channels.

10. A method according to claim 9, wherein the primer layer is exposed to radiation from an excimer laser through a mask interposed between the laser and the primer layer.

11. A method according to claim 1, wherein portions of the primer layer are ablated by exposing the primer layer to a focused excimer laser beam which scans a pattern corresponding to the insulating channels.

12. A method according to claim 1, wherein the primer layer is applied to the substrate by a method selected from the group consisting of brushing, spraying, printing, dipping or precipitation.

13. A method according to claim 1, wherein the primer is a non-conductive paste comprising a catalytic activator for non-electrical metallization.

14. A method according to claim 1, wherein the metal layer is deposited on the remaining patterned primer layer to form conducting paths by non-electrical deposition from a non-electrical metallization bath.

15. A method according to claim 1, further comprising the additional step of galvanically applying additional metal onto the deposited metal layer to increase the thickness of the conducting paths.

* * * * *